United States Patent
Chiono

(10) Patent No.: US 12,032,026 B2
(45) Date of Patent: *Jul. 9, 2024

(54) MEASURING CIRCUIT OF THE VOLTAGE OF AN ELECTRIC MACHINE, SYSTEM AND PROCESS FOR ESTIMATING THE TEMPERATURE OF THE MAGNETS OF ELECTRIC MACHINES USING SUCH CIRCUIT

(71) Applicant: MAVEL EDT S.P.A., Pont Saint Martin (IT)

(72) Inventor: Denny Chiono, Pont Saint Martin (IT)

(73) Assignee: MAVEL EDT S.P.A., Pont Saint Martin (IT)

( * ) Notice: Subject to any disclaimer, the term of this patent is extended or adjusted under 35 U.S.C. 154(b) by 170 days.

This patent is subject to a terminal disclaimer.

(21) Appl. No.: 17/904,560

(22) PCT Filed: Feb. 25, 2020

(86) PCT No.: PCT/IT2020/000022
§ 371 (c)(1),
(2) Date: Aug. 18, 2022

(87) PCT Pub. No.: WO2021/171322
PCT Pub. Date: Sep. 2, 2021

(65) Prior Publication Data
US 2023/0083791 A1  Mar. 16, 2023

(51) Int. Cl.
*G01R 1/30* (2006.01)
*G01R 31/34* (2020.01)

(52) U.S. Cl.
CPC .................. *G01R 31/343* (2013.01)

(58) Field of Classification Search
CPC .................................... G01R 31/343
See application file for complete search history.

(56) References Cited

U.S. PATENT DOCUMENTS

| | | | |
|---|---|---|---|
| 4,451,770 A | 5/1984 | Boettner et al. | |
| 2008/0036415 A1 | 2/2008 | Kaizuka et al. | |
| 2015/0372631 A1* | 12/2015 | Fedigan | G01R 31/343 318/490 |
| 2016/0274152 A1* | 9/2016 | Seki | G01R 19/25 |

FOREIGN PATENT DOCUMENTS

| | | |
|---|---|---|
| DE | 102012209057 A1 | 12/2012 |
| EP | 2887084 A1 | 6/2015 |
| EP | 3258591 A1 | 12/2017 |

OTHER PUBLICATIONS

International Search Report, International Application No. PCT/IT2020/000022, Oct. 16, 2020 (4 pages).

* cited by examiner

*Primary Examiner* — Alesa Allgood
(74) *Attorney, Agent, or Firm* — Thomas | Horstemeyer, LLP

(57) ABSTRACT

A measuring circuit (100) is described, for the voltage of an electric machine comprising a first operational amplifier (20), at least one second operational amplifier (30), a third operational amplifier (40); a system and a process for estimating the temperature of the magnets of electric machines using such circuit (100) are further described.

5 Claims, 2 Drawing Sheets

Figure 1:
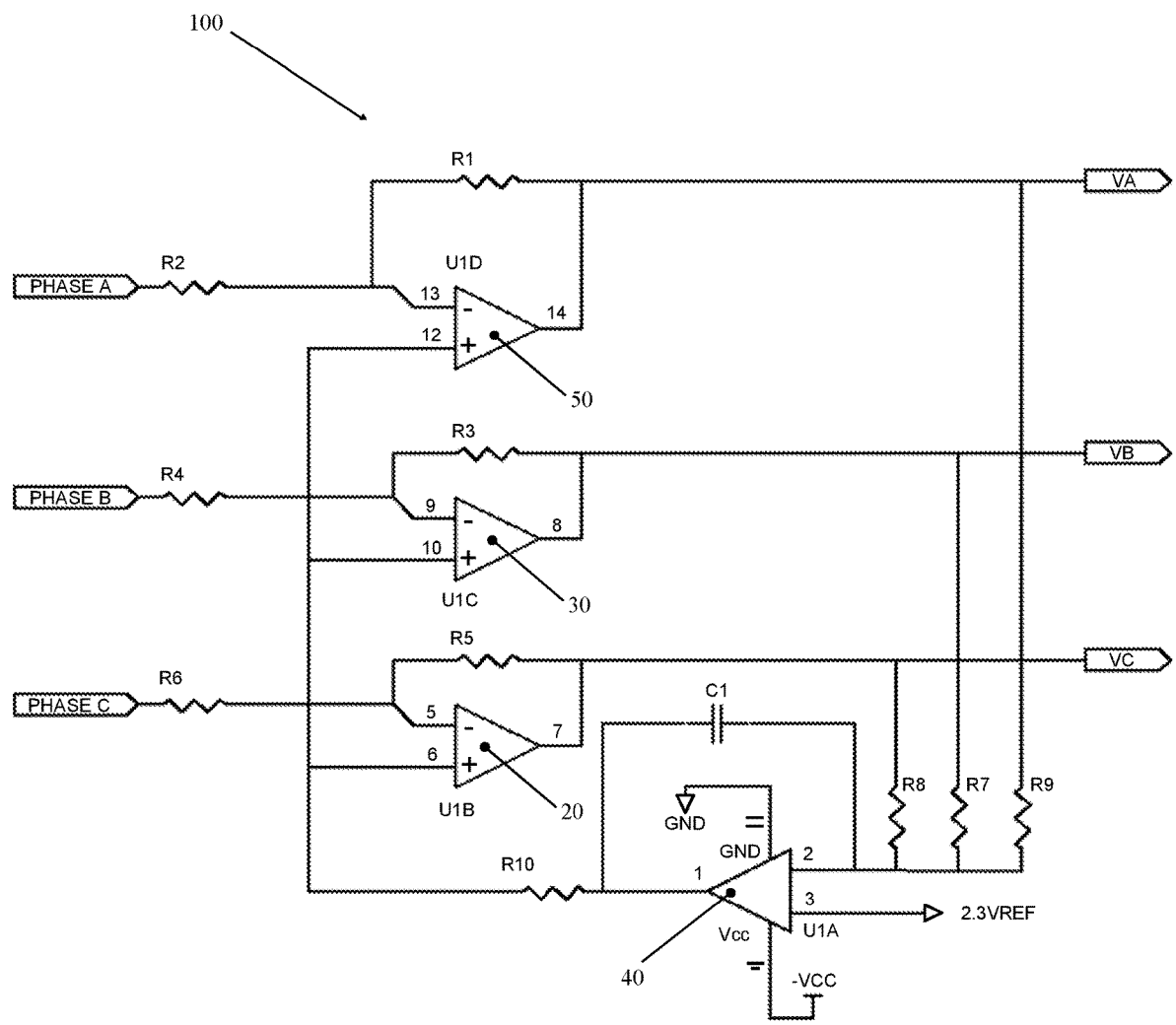

MEASURING CIRCUIT OF THE VOLTAGE OF AN ELECTRIC MACHINE, SYSTEM AND PROCESS FOR ESTIMATING THE TEMPERATURE OF THE MAGNETS OF ELECTRIC MACHINES USING SUCH CIRCUIT

The present invention refers to a measuring circuit of the voltage of an electric machine, to a system and a process for estimating the temperature of the magnets of electric machines using such circuit.

In particular, the invention refers to a measuring circuit of the voltage of an electric motor, more in particular for measuring the phase voltages of a synchronous, reluctance electric motor, of the type With permanent magnets, but can be used with any type of electric machine with permanent magnets; the invention further refers to a system and a process for estimating the temperature of the magnets of an electric motor with permanent magnets using such circuit.

In high-performance electric motors with permanent magnets, one of the most important parameters which must be kept under control is the temperature of the magnets of the machine.

In fact, if the maximum temperature limit of the magnet, for example 180° C. in a type of known motors, is exceeded, there is a risk of permanently/irreversibly demagnetizing the magnet, making the electric motor unusable.

Known motors have the problem that they do not allow the direct measure of the rotor temperature while the motor is in its operating condition, through known methods for measuring the temperature, for example with thermocouples, thermistors like those used to measure the stator temperature, since the rotor movement prevents their use.

In order to prevent magnets of known electric motors from exceeding their limit temperatures, bench tests are preformed to verify the limit operating conditions of the motor which keep the magnets inside the rotor within the maximum temperature limit, and these data are used to establish the limit driving conditions of the motor which must not be exceeded, to avoid reaching demagnetizing temperatures of the magnets.

No systems or processes are known for estimating the temperature of the magnets of an electric machine during the machine operation.

Object of the present invention is providing a measuring circuit of the voltage of an electric machine which can be used0 in a system and a process for estimating the temperature of the magnets of an electric machine.

The above and other objects and advantages of the invention, as will result from the following description, are obtained with a measuring circuit of the voltage of an electric machine, a system and a process for estimating the temperature of the magnets of electric machines as claimed in the independent claims.

Preferred embodiments and non-trivial variations of the present invention are the subject matter of the dependent claims.

It is intended that all enclosed claims are an integral part of the present description.

It will be immediately obvious that numerous variations and modifications (for example related to shape, sizes, arrangements and parts with equivalent functionality) can be made to hat is described, without departing from the scope of the invention as detailed in the enclosed claims.

Figure 2:
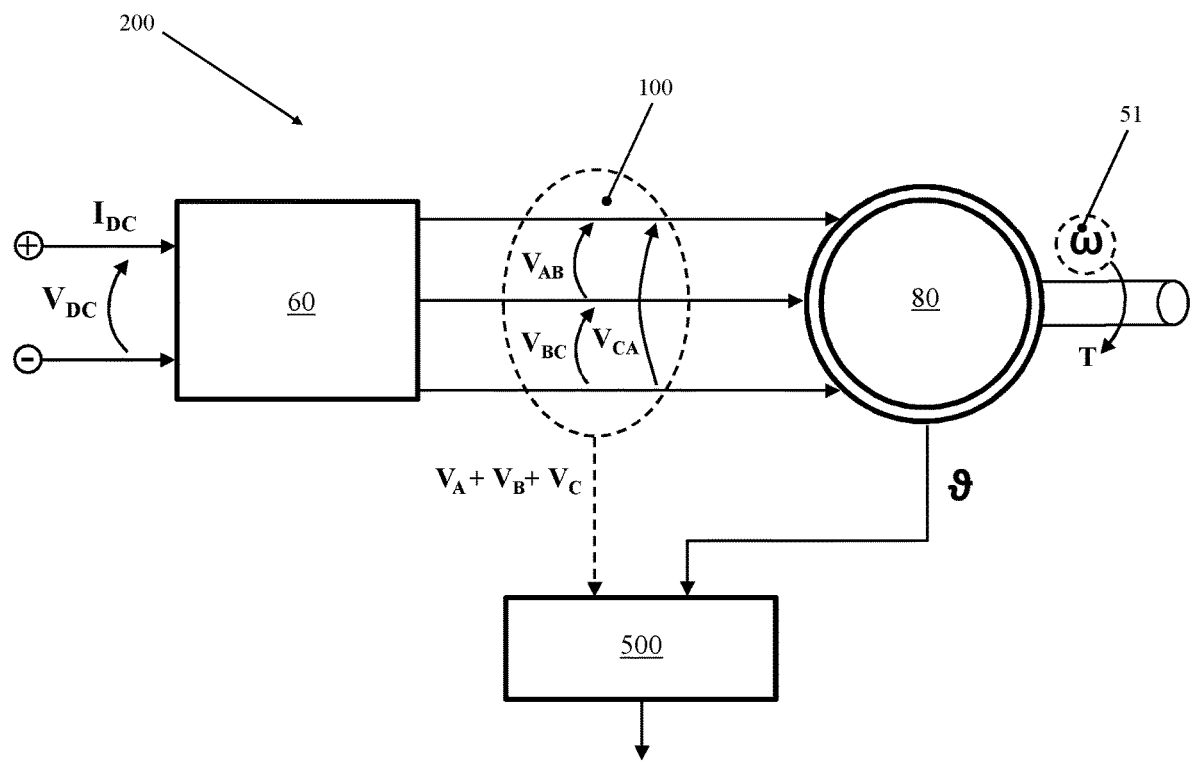

The present invention will be better described by some preferred embodiments thereof, provided as a non-limiting example, with reference to the enclosed drawings, in which:

FIG. 1 shows a schematic view of a measuring circuit of the voltage of an electric machine according to the invention; and FIG. 2 shows a schematic view of a system for estimating the temperature of the magnets of electric machines according to the invention.

With reference to the Figures, the measuring circuit 100 of the voltage of an electric machine according to the invention comprises a first operational amplifier 20 having its non-inverting input 5 connected to a non-inverting input 10 of at least one second operational amplifier 30, and its output 7 feedback connected, through a resistance R5, to the inverting input 6, said inverting input 6 of the first operational amplifier 20 being further connected through a resistance R6 to a first phase C of the input current to an electric machine, coming for example from an inverter 60; the output 7 of the first operational amplifier 20 is connected, through a resistance R8, to the inverting input 2 of a third operational amplifier which has its non-inverting input 3 connected to a reference voltage VREF, said output 7 of the first operational amplifier 20 being further connected to a first output VC of the circuit, which is at a voltage value equal to the voltage of a first phase of the electric machine to be measured, said third operational amplifier 40 having its output 1 feedback connected, through a capacitance Cl, to the inverting input 2, said output 1 of the third operational amplifier 40 being further connected through a resistance R10 to the non-inverting input 5 of the first operational amplifier 20 and to the non-inverting input 10 of the second operational amplifier 30. The second operational amplifier 30 comprises its output 8 feedback connected, through a resistance R3, to the inverting input 9, said inverting input 9 being further connected through a resistance R4 to a second phase 13 of the input current to the electric machine, coming for example from the inverter 60; the output 8 of the second operational amplifier 30 is connected, through a resistance R7, to the inverting input 2 of the third operational amplifier 40 and is further connected to a second output VB of the circuit, which is at a voltage value equal to the voltage of a second phase of the electric machine to be measured.

Preferably, the measuring circuit 100 of the voltage of an electric machine according of the invention further comprises a fourth operational amplifier 50 having its non-inverting input 12 connected to a non-inverting input 5, 10 of the first 20 and of the second 30 operational amplifiers, and its output 14 feedback connected, through a resistance R1, to the inverting input 13, said inverting input 13 being further connected through a resistance R2 to a third phase A of the input current to the electric machine, coming for example from the inverter 60; the output 14 of the fourth operational amplifier 50 is connected, through a resistance R9, to the inverting input 2 of the third operational amplifier 40 and is further connected to a third output VA of the circuit, which is at a voltage value equal to the voltage of a third phase of the electric machine to be measured.

The measuring circuit 100 of the voltage of an electric machine of the invention then comprises three inputs, each one electrically connected to the three phases A, B, C of the input current to the electric machine, coming for example from the inverter 60, and three outputs0 VA, VB, VC which are each one at the value of the voltage of a phase of the electric machine to be measured.

The control system 200 of an electric machine 80, preferably a high-performance electric motor with permanent magnets, of the invention comprises: a position sensor 51 of a known type, for example an encoder or a resolver, configured top detect the angular position of a rotor of the electric machine 80; the electric machine 80, electrically connected to an inverter 60 configured to transform a continuous voltage supplied by electric supply means into an alternate voltage for a power supply of the electric machine 80; the measuring circuit 100 of the voltage of an electric machine according to the invention.

The control system 200 of an electric machine 80 of the invention further comprises an electronic control unit of a known type comprising a microprocessor and memory means, configured to process through suitable computer programs the data detected by the sensors and drive the electric machine 80, and perform the process for estimating the temperature of the magnets of electric machines of the invention, described below.

The invention further comprises a high-performance electric motor with permanent magnets comprising the previously described control system 200.

The process for estimating the temperature of the magnets of electric machines, preferably a high-performance electric motor with permanent magnets, of the invention comprises the following steps:

a first step wherein the inverter 60 is turned off and the electric machine 80 is left rotating with no load;

a second step, simultaneous with the first step, of detecting the angular position θ of a rotor of the electric machine 80 through a position sensor 51 of a known type, for example an encoder or a resolver;

a third step, simultaneous with the first and the second step, of detecting the values of the phase voltage $V_{fase}$, $V_A$, $V_B$, $V_C$ of the electric machine 80 with no load (back electromotive force or BEMF, Back Electro Magnetic Force), by means of the measuring circuit 100 of the voltage of an electric machine of the invention;

a fourth step of estimating the magnetic flux of the rotor concatenated by the stator windings, or concatenated flux λ, performed by processing, preferably through a computer program executed by a microprocessor, the values of the phase voltage $V_{fase}$, $V_R$, $V_B$, $V_C$ detected in the third step of the process as output to the measuring circuit 100 of the voltage of an electric machine of the invention, the detected values in the second step of the process by the position sensor 51 from which the rotation speed of the rotor n is obtained (through processing by a computer program), and parameters of the electric machine 80;

a fifth step 500 of computing the temperature $T_{rot}$ of the magnets of the rotor performed by processing, preferably through a computer program executed by a microprocessor, the values of the concatenated flux λ detected in the fourth step of the process, and parameters of the electric machine 80.

In a preferred way, in the fourth step the estimation of the concatenated flux λ from an electric machine 80 is performed by using the following formula:

$$\lambda = \frac{V_{fase}}{n \cdot \frac{2\pi}{60} \cdot p}$$

wherein:
$V_{fase}$ is the phase voltage of the electric machine 80 with no load, measured through the voltage measuring circuit 100 of the invention; n is the rotation speed of the rotor of the electric machine 80 in RMP; p is the number of polar torques of the electric machine 80.

Preferably, the fifth step 500 of computing the temperature $T_{rot}$ of the magnets of the rotor of the electric machine 80 is performed by using the following formula:

$$T_{rot} = T_0 + \frac{(1 - \lambda/\lambda_0)}{\alpha}$$

wherein:
$T_{rot}$ is the estimated rotor temperature; $T_0$ is the reference ambient temperature in which the concatenated flux λ (20° C.) is known; λ is the concatenated flux measured in the fourth step; $\lambda_0$ is the reference concatenated flux measured in a similar way to the fourth step, but at the reference ambient temperature and usually it is measured only once for every type of electric machine 80, and then used as constant in the formula for computing the rotor temperature; α is the temperature coefficient of the induction, linked to the features of the magnet, usually defined in the magnet datasheet.

The invention claimed is:

1. A measuring circuit of a voltage of an electric machine comprising a first operational amplifier having its non-inverting input connected to a non-inverting input of at least one second operational amplifier and its output feedback connected, through a resistance to the inverting input, the inverting input of the first operational amplifier being further connected through a resistance to a first phase of the input current to an electric machine, the output of the first operational amplifier being connected, through a resistance, to the inverting input of a third operational amplifier which has its non-inverting input connected to a reference voltage, the output of the first operational amplifier being further connected to a first output of the circuit, which is at a voltage value equal to the voltage of a first phase of the electric machine to be measured, the third operational amplifier having its output feedback connected, through a capacitance, to the inverting input, the output of the third operational amplifier being further connected through a resistance to the non-inverting input of the first operational amplifier and to the non-inverting input of the second operational amplifier, the second operational amplifier comprising its output feedback connected, through a resistance, to the inverting input, the inverting input being further connected through a resistance to a second phase of the input current to the electric machine, the output of the second operational amplifier being connected, through a resistance, to the inverting input of the third operational amplifier and being further connected to a second output of the circuit, which is at a voltage value equal to the voltage of a second phase of the electric machine to be measured.

2. The measuring circuit of claim 1, further comprising a fourth operational amplifier having its non-inverting input connected to the non-inverting input of the first operational amplifier and of the second operational amplifier, and its output feedback connected, through a resistance, to the inverting input, the inverting input being further connected through a resistance to a third phase of the input current to the electric machine, the output of the fourth operational amplifier being connected, through a resistance, to the inverting input of the third operational amplifier and being further connected to a third output of the circuit, which is at a voltage value equal to the voltage of a third phase of the electric machine to be measured.

3. A control system of an electric machine comprising: a position sensor configured to detect an angular position of a rotor of the electric machine; the electric machine electrically connected to an inverter configured to transform a continuous voltage supplied by electric supply means into an alternate voltage for a power supply of the electric machine; and the voltage measuring circuit of an electric machine of claim 1.

4. The control system of claim 3, further comprises an electronic control unit comprising a microprocessor and memory means, configured to process through suitable computer programs the data detected by the sensors and drive the electric machine.

5. An electric motor with permanent magnets comprising the control system of claim 3.

\* \* \* \* \*